United States Patent
King

[11] Patent Number: 6,117,727
[45] Date of Patent: Sep. 12, 2000

[54] MANUFACTURING PROCESS OF CAPACITOR

[75] Inventor: Wei-Shang King, Hsinchu, Taiwan

[73] Assignee: Mosel Vitelic Inc., Taiwan

[21] Appl. No.: 09/116,693

[22] Filed: Jul. 15, 1998

[30] Foreign Application Priority Data

Feb. 27, 1998 [TW] Taiwan ................................ 87102935

[51] Int. Cl.$^7$ .............................................. H01L 21/8242
[52] U.S. Cl. .......................................... 438/254; 438/255
[58] Field of Search .................................... 438/253–256, 438/393–399

[56] References Cited

U.S. PATENT DOCUMENTS 5,804,481 12/1998 Tseng ..................................... 438/255
5,851,878 12/1998 Huang .

*Primary Examiner*—Jey Tsai
*Attorney, Agent, or Firm*—Skjerven Morrill MacPherson LLP; Carmen C. Cook; Alan H. MacPherson

[57] ABSTRACT

A method for manufacturing a capacitor includes the steps of a) forming a sacrificial layer over the etching stop layer, b) partially removing the sacrificial layer, the etching stop layer, and the dielectric layer to form a contact window, c) forming a first conducting layer over the sacrificial layer and in the contact window, d) partially removing the first conducting layer and the sacrificial layer to expose a portion of the sacrificial layer and retain a portion of the first conducting layer, e) forming a second conducting layer on tops and sidewalls of the portion of the first conducting layer and the portion of the sacrificial layer, f) partially removing the second conducting layer while retaining a portion of the second conducting layer alongside the portion of the first conducting layer and the portion of the sacrificial layer, and removing the portion of the sacrificial layer to expose the etching stop layer, and g) forming a rugged conducting layer on surfaces of the portion of the first conducting layer and the portion of the second conducting layer to construct a capacitor plate with a generally crosssectionally modified T-shaped structure having a rough surface.

22 Claims, 8 Drawing Sheets

MANUFACTURING PROCESS OF CAPACITOR

FIELD OF THE INVENTION

The present invention is related to a structure and a manufacturing method of a capacitor, and especially to a structure and a manufacturing method of a capacitor applied to the dynamic random access memory (DRAM).

BACKGROUND OF THE INVENTION

It is well known that the capacity of a capacitor is related to the quality of dynamic random access memory (DRAM). Therefore, many methods have been developed for increasing the capacity of capacitor.

First of all, please refer to FIGS. 1(a)~(b) showing a conventional method for manufacturing a capacitor. This method is detailedly described as follows.

Shown in FIG. 1(a) includes the steps of (1) forming an interlayer dielectric (ILD) 11 over a silicon substrate 10 by chemical vapor deposition (CVD) or lower pressure chemical vapor deposition (LPCVD), (2) defining a contact window by photolithography and partially removing the ILD 11 to form the contact window 12, (3) forming a doped polysilicon layer 13 with a thickness of 1000 Å over the ILD 11 and in the contact window 12 by LPCVD, and (4) forming a rugged polysilicon layer 14 with a thickness of 850 Å over the doped polysilicon layer 13 to increase the surface area of the capacitor.

In FIG. 1(b), the steps include: 1) defining the capacitor region by photolithography and partially etching the rugged polysilicon layer 14 and the doped polysilicon layer 13 to expose a portion of the ILD 11; 2) forming an oxide-on-nitride-on-oxide (ONO) layer 15 on the rugged polysilicon layer 14 and the ILD 11 and alongside the doped polysilicon ayer 13 by LPCVD; and 3) forming another doped polysilicon layer 16 ver the ONO layer 15 to construct the conventional capacitor.

Please refer to FIG. 2 showing another conventional method. The detailed steps are illustrated as follows.

In FIG. 2(a), the steps include: (1) forming an interlayer dielectric (ILD) 21 over a silicon substrate 20 by chemical vapor deposition (CVD), (2) forming a silicon nitride 22 on ILD 21, wherein the silicon nitride 22 has a thickness of 100 Å~300 Å and serves as an etching stop layer, (3) forming a sacrificial oxide 23 on the silicon nitride 22 by CVD, (4) defining a contact window by photolithography and partially removing the ILD 21, the silicon nitride 22, and the sacrificial oxide 23 to form the contact window 24, and (5) forming a doped polysilicon layer 25 with a thickness of 1000 Å over the sacrificial oxide 23 and in the contact window 24 by LPCVD.

In FIG. 2(b), the steps include: 1) defining the capacitor region by photolithography and partially etching the doped polysilicon layer 25; 2) etching the sacrificial oxide 23 by using a buffer over etching (B.O.E.) solution containing hydrofluoric acid (HF) to expose the silicon nitride 22; 3) forming an oxide-on-nitride-on-oxide (ONO) layer 26 on the silicon nitride 22 and a top and sidewalls of the doped polysilicon layer 25 by LPCVD; and 4) forming another doped polysilicon layer 27 on the ONO layer 26 to construct the capacitor.

In addition, there is another method as shown in FIG. 3. This method is described as follows.

In FIG. 3(a), the steps include: (1) forming an interlayer dielectric (ILD) 31 over a silicon substrate 30 by CVD, (2) forming a silicon nitride 32 on ILD 31, wherein the silicon nitride 32 has a thickness of 100 Å~300 Å and serves as an etching stop layer, (3) forming a first sacrificial oxide 33 on the silicon nitride 32 by CVD, (4) defining a contact window by photolithography and partially removing the first sacrificial oxide 33, the silicon nitride 32, and the ILD 31 to form the contact window 34, (5) forming a first doped polysilicon layer 35 with a thickness of 1000 Å over the first sacrificial oxide 33 and in the contact window 34 by LPCVD, and (6) forming a second sacrificial oxide 36 on the first doped polysilicon layer 35 by CVD.

In FIG. 3(b), the steps include: 1) defining the capacitor region by photolithography and partially etching the second sacrificial oxide 36, the first doped polysilicon layer 35, and the first sacrificial oxide 33, wherein the silicon nitride 32 serves as an etching stop layer; 2) forming a second doped polysilicon layer 37 on the top surface of the second sacrificial oxide 36, alongside the second sacrificial oxide 36, the first doped polysilicon layer 35, and the first sacrificial oxide 33, as well as on the silicon nitride 32.

In FIG. 3(c), the second doped polysilicon layer 37 is etched by dry etching (i.e. an anisotropic etching) to expose the top surface of the second sacrificial oxide 36 and a portion of the silicon nitride 32.

In FIG. 3(d), the second sacrificial oxide 36 is completely removed by using a buffer over etching (B.O.E.) solution containing hydrofluoric acid (HF) to expose the first doped polysilicon layer 35. Thereafter, an oxide-on-nitride-on-oxide (ONO) layer 38 is formed over the portion of the silicon nitride 32, the second doped polysilicon layer 37, and the first doped polysilicon layer 35 by LPCVD. Finally, another doped polysilicon layer 39 is formed on the ONO layer 38 to construct the capacitor.

However, these conventional methods have some defects described as follows:

1. In FIGS. 1(a) and (b), the rugged polysilicon layer in the fixed capacitor region can not effectively increase the surface area of the capacitor. Therefore, the maximum capacity can be only increased up to two times by such a method using the rugged polysilicon layer for increasing the surface area of capacitor. Because the size of the capacitor will be getting smaller in the future, this method may be no longer effective then.
2. In the method of FIGS. 2(a) and (b), the sacrificial oxide is formed and then is etched for increasing the surface area of the capacitor, but the effect is not good enough.
3. In the method as shown in FIGS. 3(a)~(d), the cylindrical doped polysilicon can increase the surface area of the capacitor which is constructed by a doped polysilicon layer, the ONO layer, and another doped polysilicon layer. However, it can be seen from FIG. 3(d) that the surface of the capacitor is so irregular that it will seriously influence the subsequent planarization process of the semiconductor.

Therefore, the present invention is developed to improve the above-described disadvantages.

SUMMARY OF THE INVENTION

An object of the present invention is to provide a manufacturing method which can effectively increase the density and intensity of the capacitor applied to the memory unit with high density.

Another object of the present invention is to provide a structure and a manufacturing method for promoting the yield rate of a capacitor.

In the preferred embodiment of the present invention, the manufacturing method includes the steps of a) forming a sacrificial layer over the etching stop layer, b) partially removing the sacrificial layer, the etching stop layer, and the dielectric layer to form a contact window, c) forming a first conducting layer over the sacrificial layer and in the contact window, d) partially removing the first conducting layer and the sacrificial layer to expose a portion of the sacrificial layer and retain a portion of the first conducting layer, e) forming a second conducting layer on tops and sidewalls of the portion of the first conducting layer and the portion of the sacrificial layer, f) partially removing the second conducting layer while retaining a portion of the second conducting layer alongside the portion of the first conducting layer and the portion of the sacrificial layer, and removing the portion of the sacrificial layer to expose the etching stop layer, and g) forming a rugged conducting layer on surfaces of the portion of the first conducting layer and the portion of the second conducting layer to construct a capacitor plate.

In accordance with one aspect of the present invention, the dielectric layer is formed by a chemical vapor deposition (CVD).

In accordance with another aspect of the present invention, the dielectric layer is a nondoped silicon glass (NSG) layer with a thickness ranged between 1000 Å and 3000 Å.

In accordance with another aspect of the present invention, the etching stop layer is formed by a chemical vapor deposition. Preferably, the etching stop layer is a silicon nitride layer with a thickness ranged between 100 Å and 300 Å.

In accordance with another aspect of the present invention, in the step (a), the sacrificial layer is formed by a chemical vapor deposition. Preferably, the sacrificial layer is a sacrificial oxide with a thickness more than 6000 Å.

In accordance with another aspect of the present invention, in the step (b), the contact window is formed by a photolithographic and etching technique.

In accordance with another aspect of the present invention, in the step (c), the first conducting layer is formed by a chemical vapor deposition. Preferably, the first conducting layer is an amorphous silicon layer with a thickness ranged between 1000 Å and 3000 Å.

In accordance with another aspect of the present invention, in the step (d), the first conducting layer and the sacrificial layer are partially removed by a photolithographic and etching technique.

In accordance with another aspect of the present invention, in the step (e), the second conducting layer is formed by a chemical vapor deposition. Preferably, the second conducting layer is an amorphous silicon layer with a thickness ranged between 1000 Å and 3000 Å.

In accordance with another aspect of the present invention, in the step (f), the second conducting layer is partially removed by an anisotropic etching.

In accordance with another aspect of the present invention, in the step (f), the portion of the sacrificial layer is removed by a wet etching using a buffer over etching (B.O.E.) solution containing hydrofluoric acid (HF).

In accordance with another aspect of the present invention, in the step (g), the rugged conducting layer is a hemispherical grained silicon (HSG) layer formed by an annealing process at a temperature ranged between 580° C. and 620° C.

The step (g) further comprises a step to perform a treatment of phosphoric acid for enhancing a rough surface of the rugged conducting layer.

This method further includes a step after the step (g) to execute an ion implantation on the rugged conducting layer by using one of arsenic(As) and phosphorus (P).

After the step (g), this method further includes the steps of h) forming another dielectric layer over the etching stop layer and the rugged conducting layer, and i) forming a third conducting layer over the another dielectric layer to serve as another capacitor plate.

In accordance with another aspect of the present invention, the another dielectric layer and the third conducting layer are formed by a low pressure chemical vapor deposition (LPCVD).

In accordance with another aspect of the present invention, the another dielectric layer is an oxide-on-nitride-on-oxide (ONO) layer with a thickness ranged between 50 Å and 200 Å.

In accordance with another aspect of the present invention, the third conducting layer is a doped polysilicon layer.

Furthermore, the present invention provides a capacitor with a unique structure which can be applied to a memory unit including a substrate forming thereon a dielectric layer forming thereon an etching stop layer. The capacitor includes a structure formed in the dielectric layer and the etching stop layer and forming a contact window, a first conducting layer filling in the contact window and upwardly extended to form a generally crosssectionally modified T-shaped structure having a horizontal part and a vertical part where the horizontal part has an end thereof extended and the space between the horizontal part and the etching stop layer are adapted to be occupied by a dielectric layer and a conducting layer, and a rugged conducting layer formed on a surface of the first conducting layer to construct a capacitor plate.

Preferably, the first conducting layer is an amorphous silicon layer. The rugged conducting layer can be a hemispherical grained silicon (HSG) layer.

In addition, the capacitor includes another dielectric layer formed on surfaces of the rugged conducting layer and the etching stop layer, and a second conducting layer formed over the another dielectric layer to construct an another capacitor plate.

The present invention may best be understood through the following description with reference to the accompanying drawings, in which:

DETAILED DESCRIPTION OF THE PREFERRED EMBODIMENT

The preferred embodiment of the method for manufacturing a capacitor according to the present invention is shown in FIGS. 4(a)–(f). The details are described as follows.

Figure 1A:
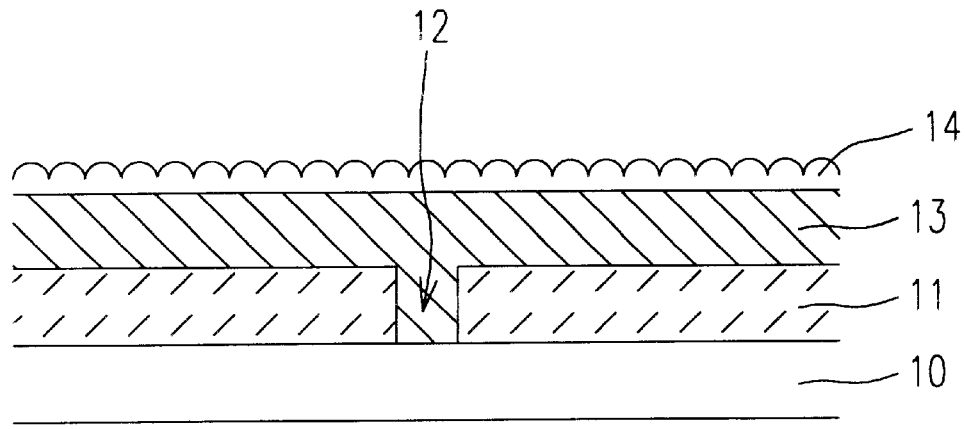
FIGS. 1(a) and 1(b) are schematic diagrams showing the first method for manufacturing a capacitor according to the prior art.
Figure 1B:
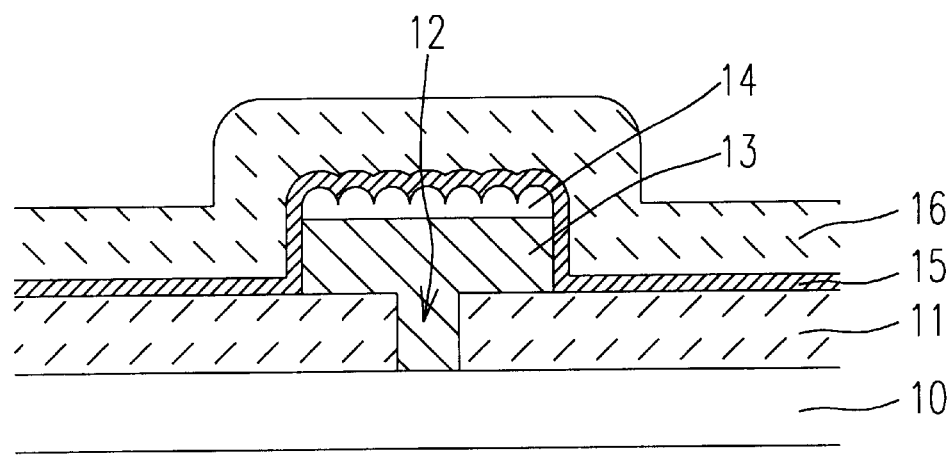
Figure 2A:
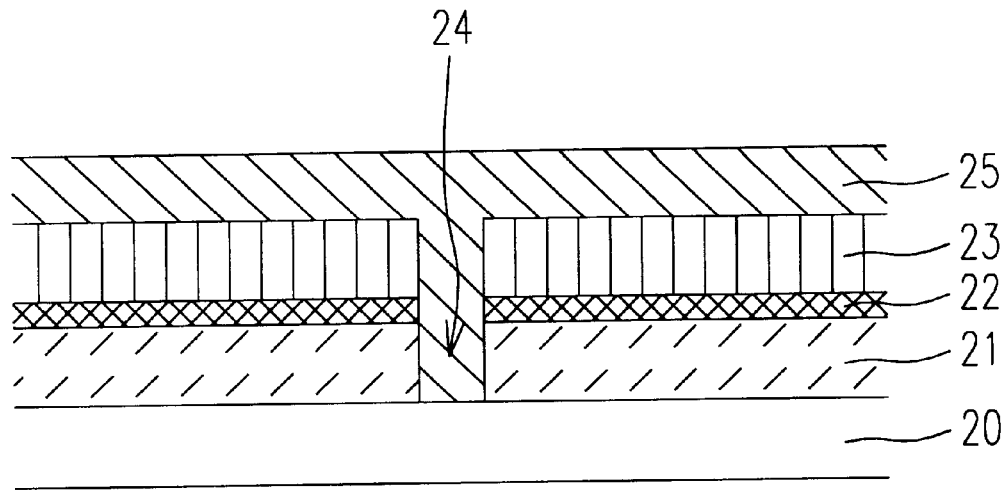
FIGS. 2(a) and 2(b) are schematic diagrams showing the second method for manufacturing a capacitor according to the prior art.
Figure 2B:
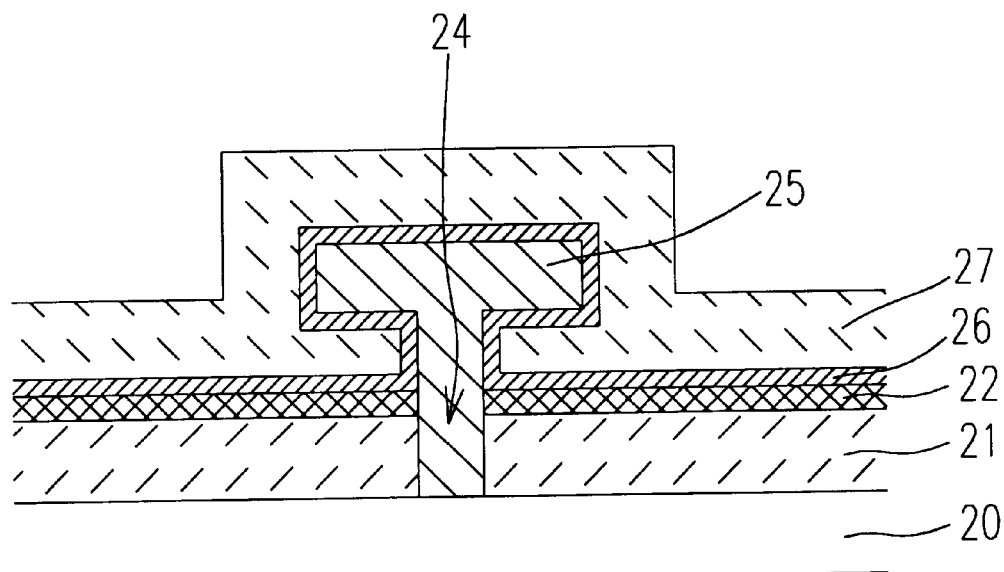
Figure 3A:
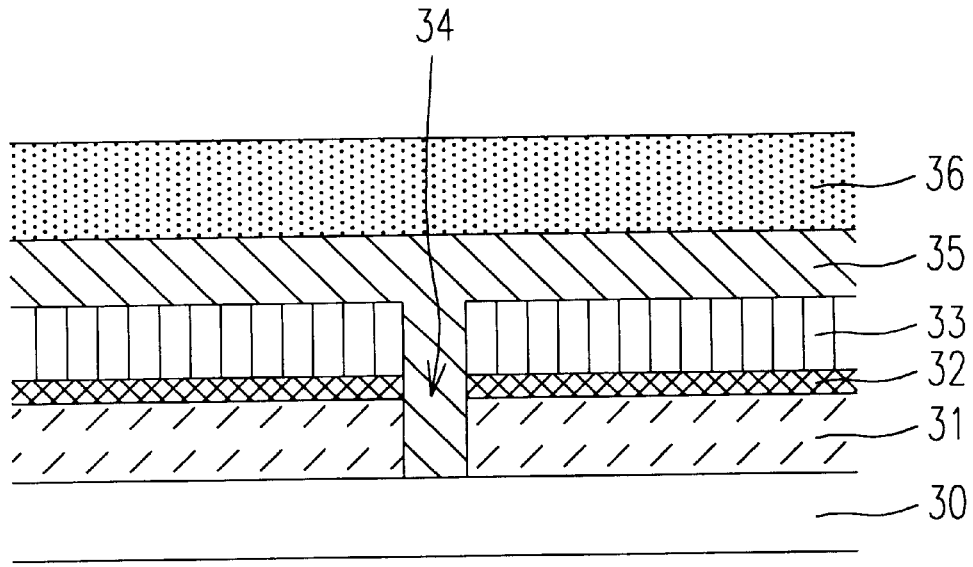
FIGS. 3(a)–3(d) are schematic diagrams showing the third method for manufacturing a capacitor according to the prior art.
Figure 3B:
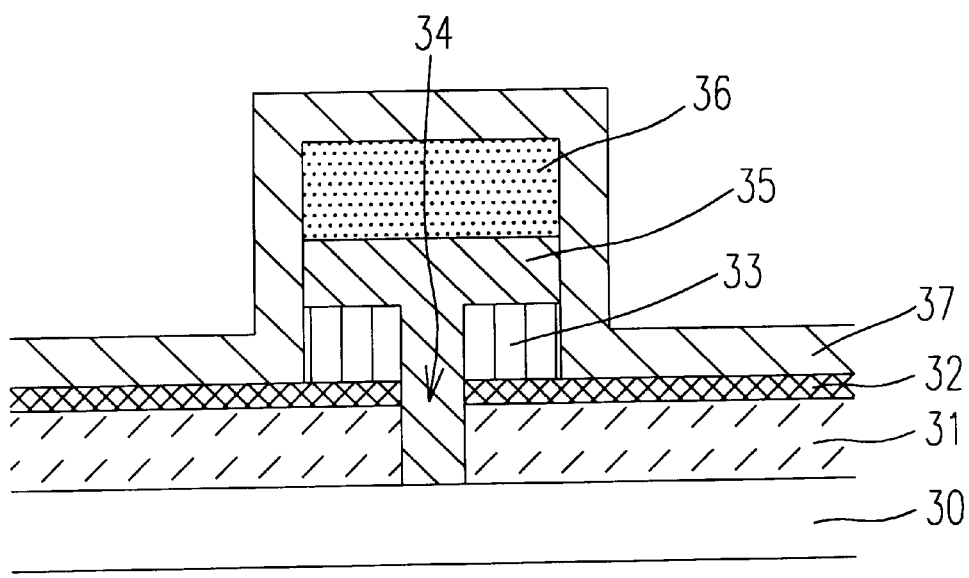
Figure 3C:
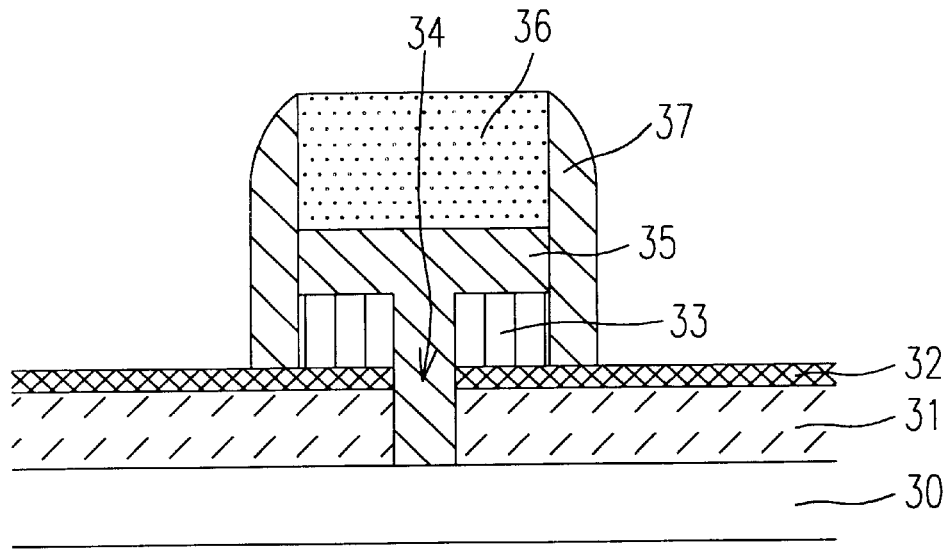
Figure 3D:
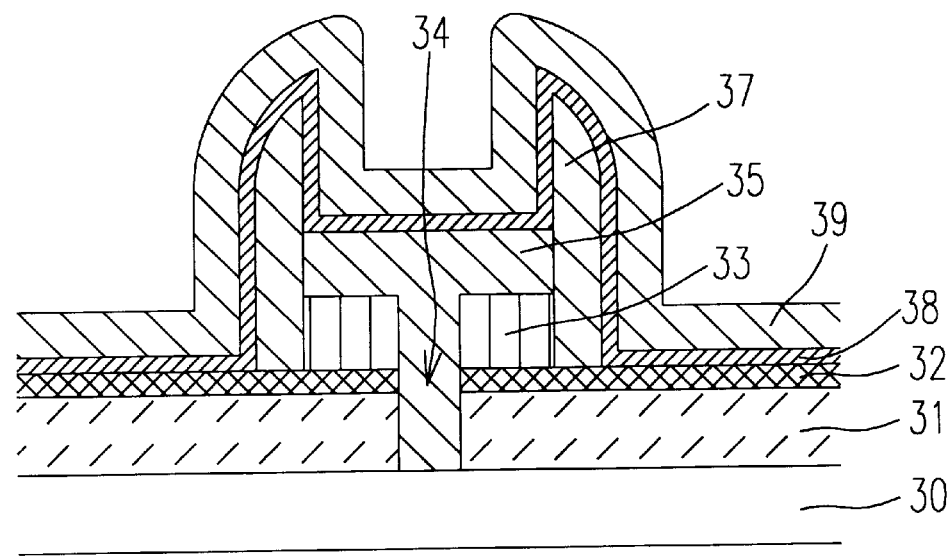
Figure 4A:
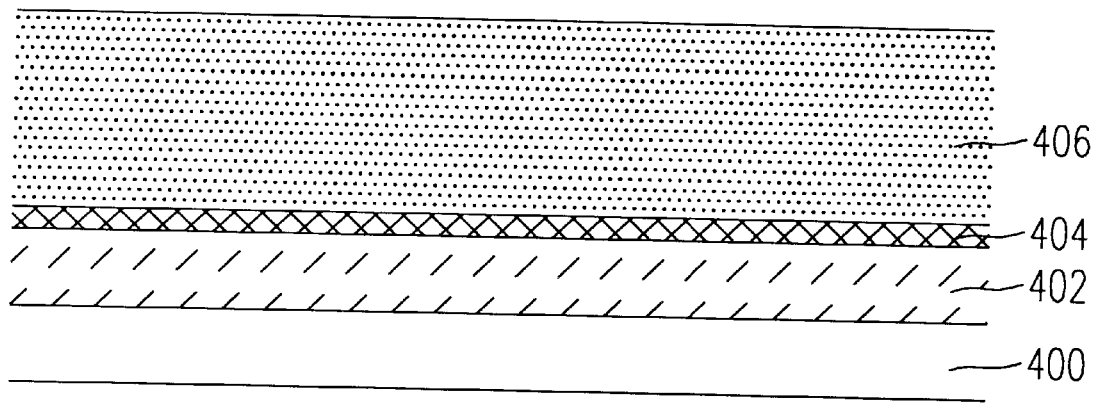
FIGS. 4(a)–4(g) are schematic diagrams showing a preferred embodiment of a method for manufacturing a capacitor according to the present invention.

In FIG. 4(a), an interlayer dielectric (ILD) 402 is formed over a substrate 400 by plasma enhanced chemical vapor deposition (PECVD) or lower pressure chemical vapor deposition (LPCVD). The ILD 402 can be a nondoped silicon glass (NSG) layer 402 with a thickness ranged between 1000 Å and 3000 Å. Thereafter, an etching stop layer 404 is formed on the ILD 402 by chemical vapor deposition. Preferably, the etching stop layer 404 is a silicon nitride 404 with a thickness ranged between 100 Å and 300 Å. A sacrificial layer 406 is then formed on the etching stop layer 404 by chemical vapor deposition. Preferably, the sacrificial layer is a sacrificial oxide 406 having a thickness more than 6000 Å, preferably 8000 Å.

Figure 4B:
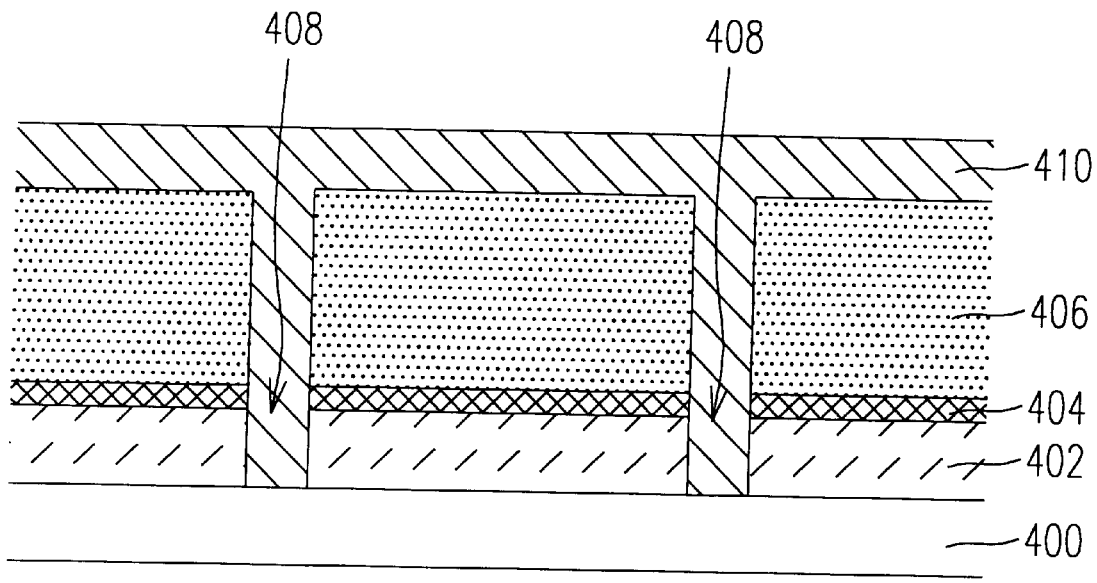

As shown in FIG. 4(b), the sacrificial oxide 406, the etching stop layer 404, and the ILD layer 402 are partially removed to form a contact window 408 by photolithography and etching process. Thereafter, a first conducting layer 410 is formed over the sacrificial layer 406 and is filled in the contact window 408 by low pressure chemical vapor deposition. Preferably, the first conducting layer 410 is an amorphous silicon layer with a thickness ranged between 1000 Å and 3000 Å, preferably 2000 Å.

Figure 4C:
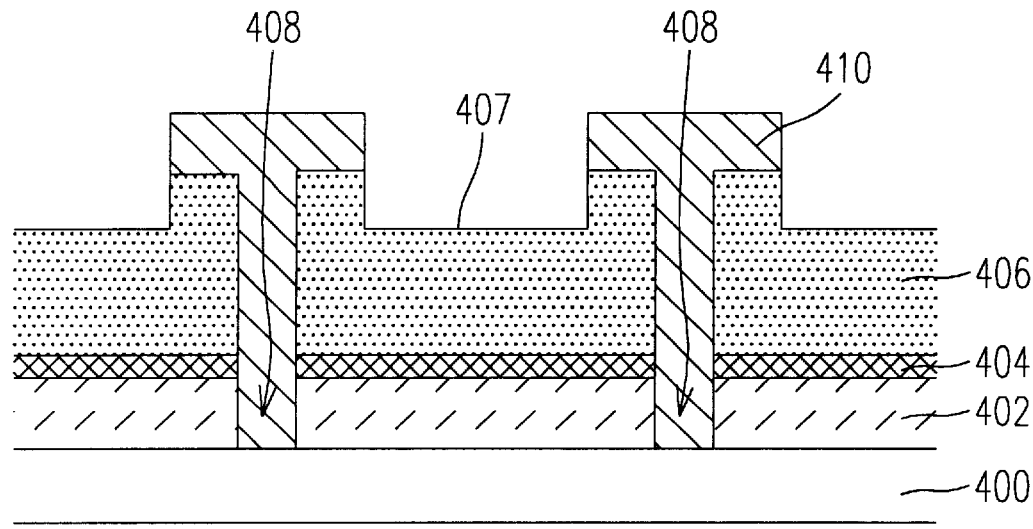

In FIG. 4(c), the first conducting layer 410 and the sacrificial oxide 406 are partially removed by photolithography and etching process to expose a portion of the sacrificial oxide 407.

Figure 4D:
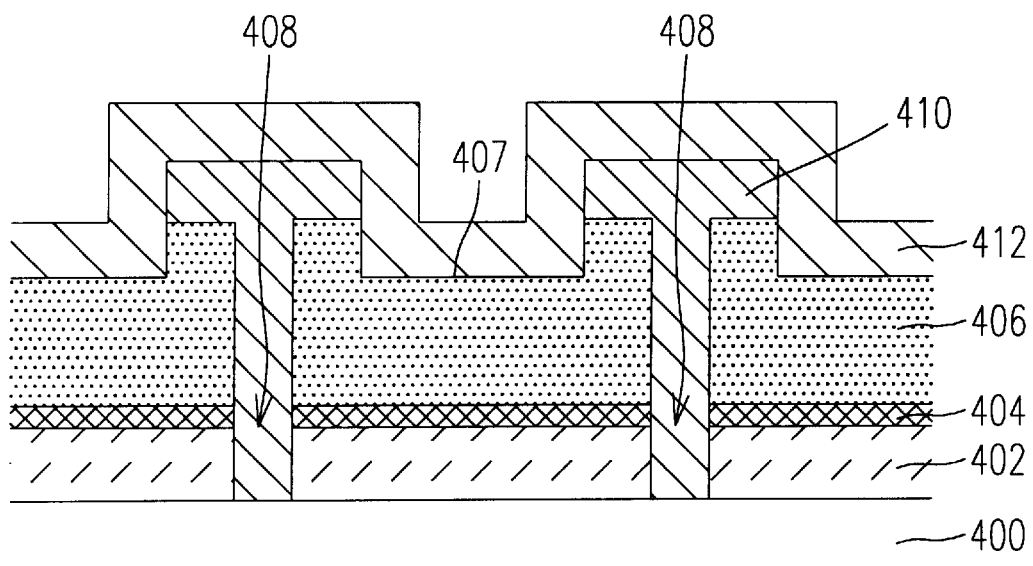

In FIG. 4(d), a second conducting layer 412 is formed over top surfaces and sidewalls of the portion of the first conducting layer 410, and the portion of the sacrificial oxide 407 by chemical vapor deposition. The second conducting layer 412 is preferably an amorphous silicon layer and has a thickness ranged between 1000 Å and 3000 Å, preferably 2000 Å.

Figure 4E:
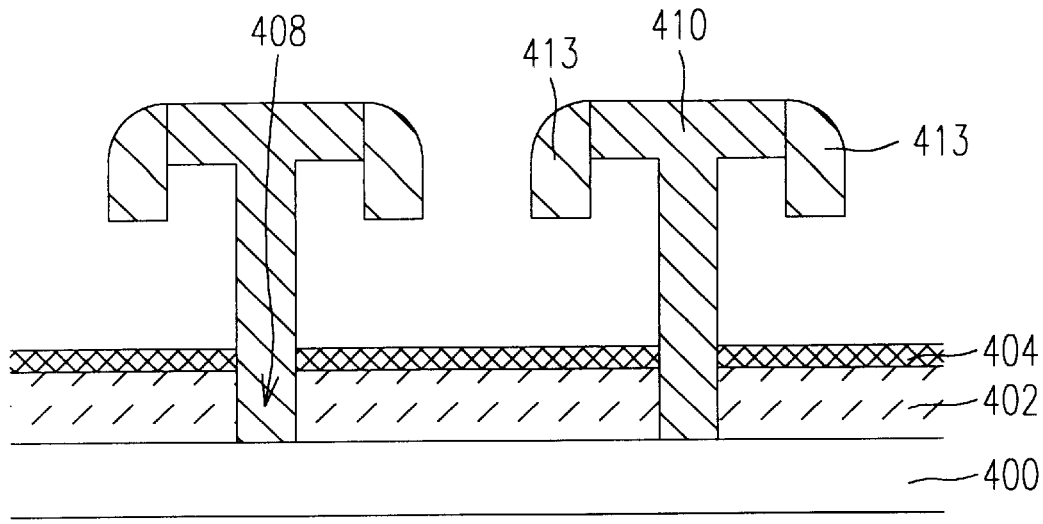

Thereafter, the second conducting layer 413 is partially removed by an anisotropic etching, such as a dry etching, while retaining a portion of the second conducting layer 413 alongside the portion of the first conducting layer 410 and the portion of the sacrificial oxide 407. The sacrificial oxide 406, 407 is then removed by a wet etching to expose the etching stop layer 404 as shown in FIG. 4(e). The wet etching can use a buffer over etching (B.O.E.) solution containing hydrofluoric acid (HF).

Figure 4F:
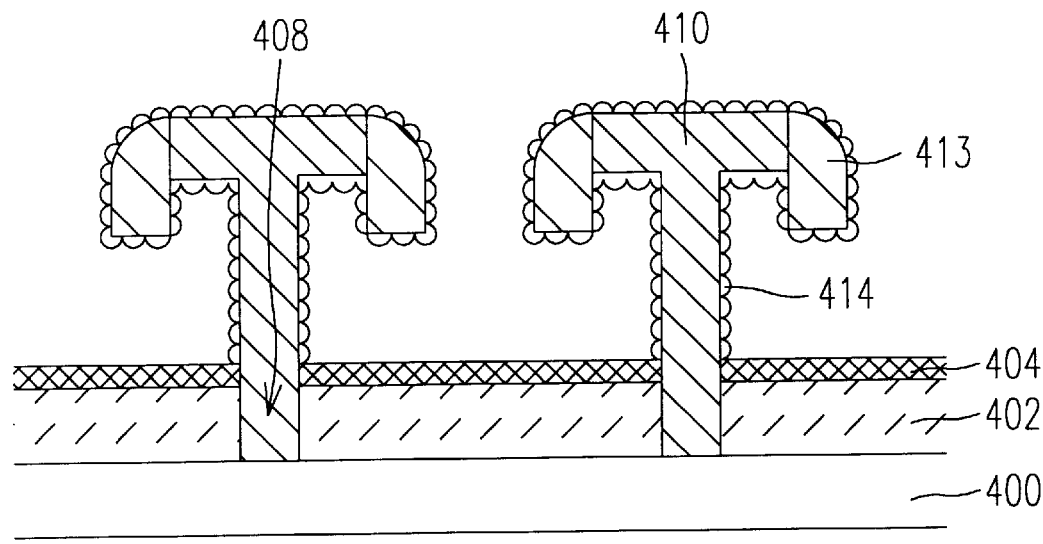

Shown in FIG. 4(f) includes a step to form a rugged conducting layer 414 on surfaces of the portion of the first conducting layer 410 and the portion of the second conducting layer 413. The rugged conducting layer 414 is a hemispherical grained silicon (HSG) layer 414 formed by an annealing process at a temperature between 580° C. and 620° C.

In addition, the rugged conducting layer 414 is treated by phosphoric acid to enhance a rough surface of the rugged conducting layer 414 for increasing the surface area of the formed capacitor. Thereafter, the rugged conducting layer 414 is doped with arsenic(As) or phosphorus (P). Finally, a lower capacitor plate is constructed by the portion of the first conducting layer 410, and the portion of the second conducting layer 413, and the rugged conducting layer 414.

Figure 4G:
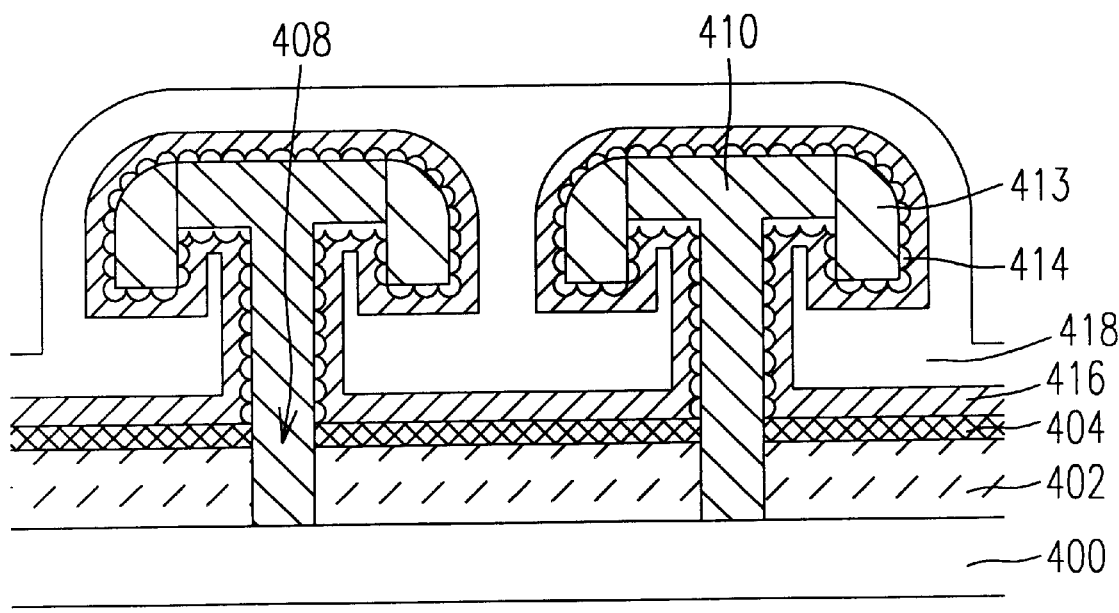

Certainly, the manufacturing method further includes other steps to obtain a complete capacitor after performing the preceding steps. As shown in FIG. 4(g), the steps include: (1) forming another dielectric layer 416 over the etching stop layer 404 and the rugged conducting layer 414; and (2) forming a third conducting layer 418 over the another dielectric layer 416. The another dielectric layer 416 and the third conducting layer 418 are formed by a low pressure chemical vapor deposition (LPCVD). The another dielectric layer 416 is preferably an oxide-on-nitride-on-oxide (ONO) layer with a thickness ranged between 50 Å and 200 Å. Preferably, the third conducting layer 418 is a doped polysilicon layer. The another dielectric layer 416 and the third conducting layer 418 serve as an upper capacitor plate. Finally, the preferred embodiment of the capacitor according to the present invention is fabricated.

According to the present invention, the method for manufacturing the capacitor is not only very simple but can effectively increase the surface area of the capacitor. More particularly, this method will construct a special capacitor structure. As shown in FIG. 4(f), an interlayer dielecrtic 402 and an etching stop layer 404, both of which are formed on a silicon substrate 400 in sequence, are partially removed for forming a contact window 408. A conducting layer (including the first conducting layer 410 and the second conducting layer 413) is filled in the contact window 408 and is upwardly extended to form a generally crosssectionally modified T-shaped structure having a horizontal part and a vertical part where the horizontal part has an end thereof extended and the space between the horizontal part and the etching stop layer are adapted to be occupied by a dielectric layer and a conducting layer. Then, a rugged conducting layer 414 is formed on a surface of the conducting layer to construct a lower capacitor plate.

Preferably, the another dielectric layer 416 is an oxide-on-nitride-on-oxide (ONO) layer with a thickness ranged between 50 Å and 200 Å. The another conducting layer 418 can be a doped polysilicon layer.

To sum up, a generally crosssectionally modified T-shaped structure, formed by the first and second conducting layers 410 and 413 according to the present invention, not only increases the surface area but is conducive to the subsequent planarization process. Furthermore, the rugged conducting layer 414 on the surface of the conducting layer 410, 413 can also contribute to an increase in the surface area of the capacitor.

Therefore, merely with a simple process, it can significantly increase the surface area of the capacitor in comparison with the preceding conventional capacitors. Certainly, the height of the sacrificial oxide and the etching depth can be optionally adjusted according to the desired capacity. Therefore, the method of the present invention provides a unique capacitor structure which can prevent the defects caused by the prior art and solve the problem of the insufficient capacity in the certain capacitor region.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for manufacturing a capacitor applied to a memory unit including a substrate forming thereon a dielectric layer forming thereon an etching stop layer, comprising steps of:
   a) forming a sacrificial layer over said etching stop layer;
   b) partially removing said sacrificial layer, said etching stop layer, and said dielectric layer to form a contact window;
   c) forming a first conducting layer over said sacrificial layer and in said contact window;

d) partially removing said first conducting layer and said sacrificial layer to expose a portion of said sacrificial layer and retain a portion of said first conducting layer;

e) forming a second conducting layer on tops and sidewalls of said portion of said first conducting layer and said portion of said sacrificial layer;

f) partially removing said second conducting layer while retaining a portion of said second conducting layer alongside said portion of said first conducting layer and said portion of said sacrificial layer, and removing said portion of said sacrificial layer to expose said etching stop layer; and g) forming a rugged conducting layer on surfaces of said portion of said first conducting layer and said portion of said second conducting layer to construct a capacitor plate.

2. A method according to claim 1 wherein said dielectric layer is formed by a chemical vapor deposition (CVD).

3. A method according to claim 1 wherein said dielectric layer is a nondoped silicon glass (NSG) layer with a thickness ranged between 1000 Å and 3000 Å.

4. A method according to claim 1 wherein said etching stop layer is formed by a chemical vapor deposition.

5. A method according to claim 1 wherein said etching stop layer is a silicon nitride layer with a thickness ranged between 100 Å and 300 Å.

6. A method according to claim 1 wherein in said step (a), said sacrificial layer is formed by a chemical vapor deposition.

7. A method according to claim 1 wherein said sacrificial layer is a sacrificial oxide with a thickness more than 6000 Å.

8. A method according to claim 1 wherein in said step (b), said contact window is formed by a photolithographic and etching technique.

9. A method according to claim 1 wherein in said step (c), said first conducting layer is formed by a chemical vapor deposition.

10. A method according to claim 1 wherein said first conducting layer is an amorphous silicon layer with a thickness ranged between 1000 Å and 3000 Å.

11. A method according to claim 1 wherein in said step (d), said first conducting layer and said sacrificial layer are partially removed by a photolithographic and etching technique.

12. A method according to claim 1 wherein in said step (e), said second conducting layer is formed by a chemical vapor deposition.

13. A method according to claim 1 wherein said second conducting layer is an amorphous silicon layer with a thickness ranged between 1000 Å and 3000 Å.

14. A method according to claim 1 wherein in said step (f), said second conducting layer is partially removed by an anisotropic etching.

15. A method according to claim 1 wherein in said step (f), said portion of said sacrificial layer is removed by a wet etching using a buffer over etching (B.O.E.) solution containing hydrofluoric acid (HF).

16. A method according to claim 1 wherein in said step (g), said rugged conducting layer is a hemispherical grained silicon (HSG) layer formed by an annealing process at a temperature ranged between 580° C. and 620° C.

17. A method according to claim 1 wherein said step (g) further comprises a step to perform a treatment of phosphoric acid for enhancing a rough surface of said rugged conducting layer.

18. A method according to claim 1 further comprising a step after said step (g) to execute an ion implantation on said rugged conducting layer by using one of arsenic(As) and phosphorus (P).

19. A method according to claim 1 further comprising steps after said step (g):

h) forming an another dielectric layer over said etching stop layer and said rugged conducting layer; and i) forming a third conducting layer over said another dielectric layer to serve as an another capacitor plate.

20. A method according to claim 19 wherein said another dielectric layer and said third conducting layer are formed by a low pressure chemical vapor deposition (LPCVD).

21. A method according to claim 19 wherein said another dielectric layer is an oxide-on-nitride-on-oxide (ONO) layer with a thickness ranged between 50 Å and 200 Å.

22. A method according to claim 19 wherein said third conducting layer is a doped polysilicon layer.

* * * * *